(12) United States Patent
Wojnarowski et al.

(10) Patent No.: US 6,297,459 B1
(45) Date of Patent: *Oct. 2, 2001

(54) PROCESSING LOW DIELECTRIC CONSTANT MATERIALS FOR HIGH SPEED ELECTRONICS

(75) Inventors: Robert John Wojnarowski, Ballston Lake; Herbert Stanley Cole, Burnt Hills; Theresa Ann Sitnik-Nieters, Clifton Park; Wolfgang Daum, Glenville, all of NY (US)

(73) Assignee: General Electric Company, Schenectady, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/019,304

(22) Filed: Feb. 5, 1998

Related U.S. Application Data

(60) Division of application No. 08/561,990, filed on Nov. 22, 1995, now Pat. No. 5,785,787, and a continuation-in-part of application No. 08/411,176, filed on Mar. 27, 1995, now Pat. No. 5,576,517, which is a division of application No. 08/247,820, filed on May 23, 1994, now Pat. No. 5,449,427.

(51) Int. Cl.[7] .................................................. H05K 1/09
(52) U.S. Cl. ........................... 174/255; 174/202; 29/852; 156/155; 428/209
(58) Field of Search .......................... 29/852, 846, 829; 156/327, 155; 174/255; 428/209, 901

(56) References Cited

U.S. PATENT DOCUMENTS

| | | | |
|---|---|---|---|
| 2,012,617 | 8/1935 | Munters | 501/80 |
| 3,576,686 | 4/1971 | Schmidle et al. | 156/77 |
| 3,681,186 | 8/1972 | Findlay et al. | 428/310.5 |
| 3,907,623 | 9/1975 | Dowbenko | 156/77 |
| 4,640,866 | * 2/1987 | Suzuki | 428/901 X |
| 4,751,136 | 6/1988 | Kamiya et al. | 428/317.1 |
| 4,755,911 | * 7/1988 | Suzuki | 361/795 |
| 5,034,801 | 7/1991 | Fischer | 257/687 |
| 5,142,775 | * 9/1992 | Wiley | 29/852 |
| 5,302,547 | 4/1994 | Wojnarowski et al. | 216/41 |
| 5,449,427 | * 9/1995 | Wojnarowski et al. | 156/155 |
| 5,785,787 | * 7/1998 | Wojnarowski et al. | 156/155 |

FOREIGN PATENT DOCUMENTS

| | | |
|---|---|---|
| 0333132 | 3/1989 | (EP) . |
| 2266181A | 10/1993 | (GB) . |
| 55001109 | 7/1980 | (JP) . |
| 09001374 | 2/1990 | (WO) . |
| 09324313 | 12/1993 | (WO) . |

OTHER PUBLICATIONS

"Fabrications of Controlled Porosity in Tape Cast Glass Ceramic Substrate Material", 6046 Materials Letters, Aug. 1989, No. 8, Amsterdam, NL, pp 278–282.

"Fabrication of Printed Circuit Wiring Boards Using Insulation Layers with Low Dielectric Constant", IBM Technical Disclosure Bulletin, vol. 31, No. 7, Dec. 1988, pp 25–26.

"UV–Laser Photoablation of Thermostatable Polymers: Polyimides, Polyphenylquinoxaline and Teflon AF", Mat. Res. Soc. Symp.Proc. vol. 227, 1991 Materials Research Society, pp 253–259.

* cited by examiner

*Primary Examiner*—Albert W. Paladini
(74) *Attorney, Agent, or Firm*—Ann M. Agosti; Jill M. Breedlove

(57) ABSTRACT

A low dielectric constant printed circuit board includes: a low dielectric constant porous polymer layer having holes therethrough, the porous layer having pores; and a patterned metallization layer over surfaces of the low dielectric constant porous polymer layer and surfaces of the holes, the patterned metallization layer not significantly protruding into the pores of the porous layer.

8 Claims, 6 Drawing Sheets

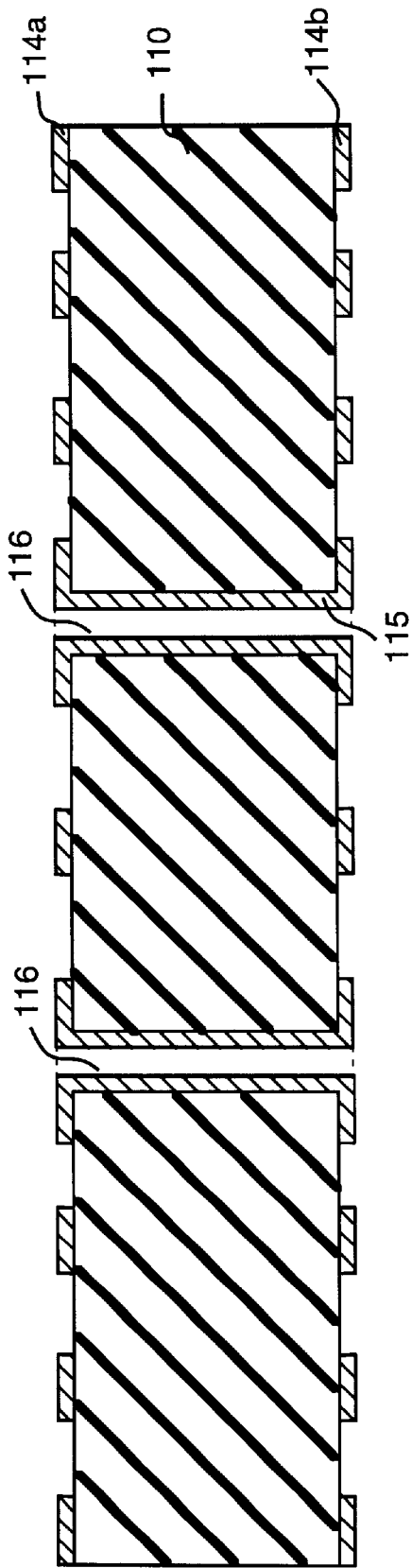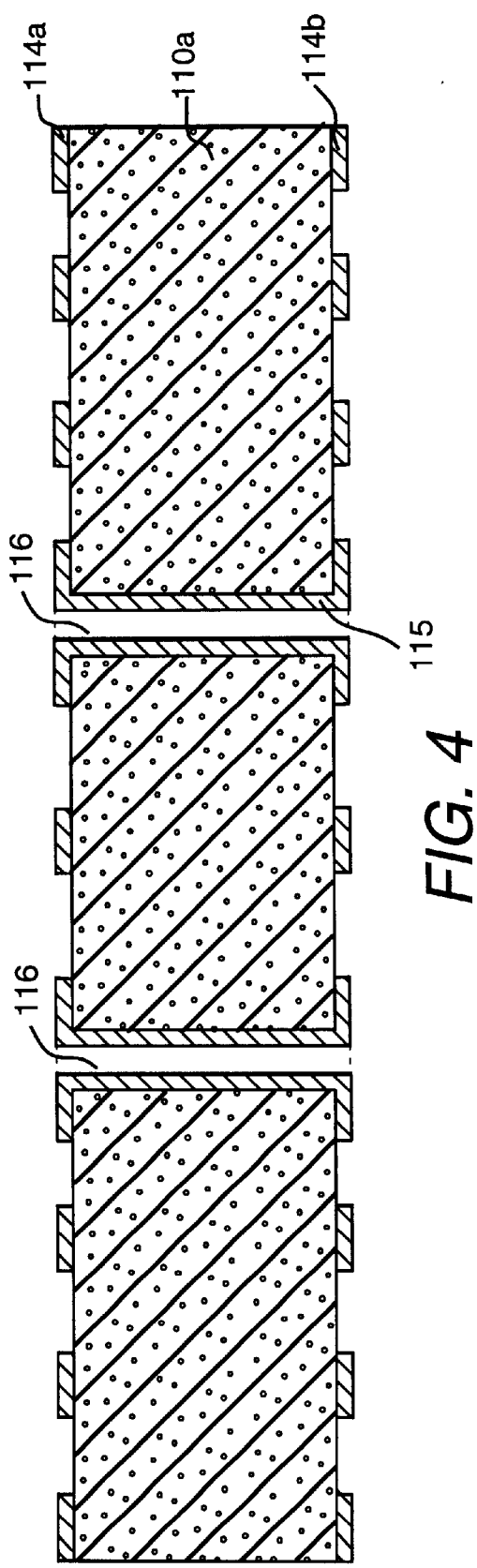

PROCESSING LOW DIELECTRIC CONSTANT MATERIALS FOR HIGH SPEED ELECTRONICS

CROSS-REFERENCE TO RELATED APPLICATIONS

This application is a Division of Ser. No. 08/561,990 filed Nov. 22, 1995, now U.S. Pat. No. 5,785,787, and also a continuation in part of U.S. application Ser. No. 08/411,176, filed Mar. 27, 1995 now U.S. Pat. No. 5,576,517, which is a division of Ser. No. 08/247,820 filed May 23, 1994 U.S. Pat. No. 5,449,427, issued Sep. 12, 1995, each of which are herein incorporated by reference.

BACKGROUND OF THE INVENTION

1. Field of the Invention

This invention relates generally to low dielectric constant porous materials and, more particularly, to a process for using porous layers in printed circuit boards.

2. Description of the Related Art

Electronic circuits have inherent limitations in high frequency applications. For example, capacitive loading is increased at higher frequencies because capacitive reactance is directly proportional to frequency. In high frequency circuits capacitive loading becomes so high that a semiconductor chip cannot drive the low reactive impedance. Because these high frequency circuits have historically been power inefficient, their usefulness in airborne and satellite applications is limited.

Porous polytetrafluoroethylene (PTFE) materials such as GORE-TEXT® (GORE-TEX is a trademark of W.L. Gore & Associates, Inc., of Newark, Del.) have excellent low dielectric constant properties, but unfortunately they absorb process chemicals in their pores during MCM (multi-chip module) or PC (printed circuit) board processing that cannot be removed. Additionally, the fact that the porous material becomes crushed during pressurized processing destroys its porous properties, and therefore the deformed material does not provide the desired consistent low dielectric constant.

In microwave circuit chip structures, certain electrical conductor paths in sensitive areas of the chip circuitry require a dielectric constant close to that of air (1) to work properly in these areas. Chip manufacturers fabricate air bridges to provide the low dielectric constant. These sensitive air bridge structures create processing challenges for both the manufacturer and the end user. Even Teflon polytetrafluoroethylene (Teflon is a trademark of E.I. DuPont de Nemours and Co.), which typically has a dielectric constant between 1.9 and 2.0, can create too much of an impedance loading effect at microwave frequencies.

The DuPont Teflon polytetrafluoroethylene materials have intrinsically low dielectric constants and have the necessary high temperature stability for most industrial and military uses. As described in Gore, U.S. Pat. No. 3,962,153, and Gore, U.S. Pat. No. 4,096,227, GORE-TEX® material is a Teflon PTFE-based material that is filled with micropores that create a foam-like cloth material. Porous PTFE material is generally used in clothes to simultaneously provide warmth and allow perspiration and moisture vapors to vent through its pores. Porous PTFE material is alternatively sold as a filled porous PTFE material. Filling the pores with a material such as an acrylate glue enables use of the material as a laminant film; however, this causes the resultant dielectric constant to degrade and limits the material's usefulness at high frequencies. Unfilled porous PTFE material is an excellent candidate for high frequency circuits because the dielectric constant can be significantly less than that found in other materials. However, in laminant applications and processing, the pores can collapse under pressure and/or be filled with processing materials during fabrication which cannot be easily removed.

Ceramic foam materials are discussed, for example, in "Giants in advanced ceramics," Ceramic Industry, vol. 141, 47 (August 1993), and Te-Kao Wu, "Dielectric properties measurement of substrate and support materials," Microwave and Optical Technology Letters, vol. 3, 283–286 (August 1990). These materials, however, are inflexible and not fabricated in large area sections. Because the ceramic foam materials are inflexible and cannot be stretched, they can be used as substrates but cannot be used in overlay technologies that are not perfectly flat. Because ceramic foam materials are fragile, they are typically not capable of withstanding PC board lamination processing in their intrinsic state. Furthermore, ceramic foam materials can be filled with processing materials which degrade their low dielectric constant.

Another problem common to both porous PTFE material and ceramic foam material is that if the porous/foam material is to be used in any process in which a metallization layer is applied over the material, the metal tends to extend into the pores and it is thus difficult to achieve a smooth and continuous metal surface for use in high frequency applications where skin-effect related losses are of importance.

Few intrinsically low dielectric constant materials can withstand the high temperatures in commercial and military processing. Most of the low dielectric constant materials that can withstand higher temperatures are only absorptive below the 200 nanometer wavelength region of the light spectrum, and thus it is nearly impossible to process those materials using ion argon and other CW (continuous wave) lasers.

PC boards typically have dielectric constants ranging from 2 through 5, and nonporous ceramics can have dielectric constants as high as 9. It would be desirable to have a low dielectric constant PC board material for use in high frequency and high speed electronics.

SUMMARY OF THE INVENTION

Accordingly, an object of the present invention is to provide a new material and method of manufacturing high frequency and high speed electronic circuits with low power capabilities.

Another object of this invention is to provide a method for processing low dielectric constant porous materials which does not leave process chemicals behind in the porous materials.

Another object of this invention is to provide low dielectric constant polymer PC boards.

This invention modifies a low dielectric constant polymeric porous material, such as porous PTFE material, which has a dielectric constant of approximately 1.2–1.3, by filling the material's pores with a sublimable (or otherwise removable) material that prevents deformation during processing and enables laser processing during high speed circuit fabrication. The term "low dielectric constant" is intended to mean a dielectric constant as close to 1 as possible and not greater than about 2. After processing, the filler material is removed, and the original porous material is left with the intrinsically low dielectric constant. The process, which enables foam-like materials to be laminated and laser machined without the use of solvents or other chemical processing, can be used in PC boards, MCM modules, and anywhere else low dielectric constant surfaces are desired.

Porous PTFE material is approximately 70% air and is generally made by stretching PTFE to cause approximately nine billion holes per square inch to be distributed evenly throughout its volume. The resulting structure is a filter type material in that gas or liquid can pass through the interconnected pores. This porous structure is composed of mostly air and can readily be filled with a sublimable material. The resulting porous material can be used as a low dielectric constant material in the manufacture of high frequency circuits and can reduce the need for laser ablation of material situated over air bridge structures and other microwave structures and devices.

Briefly, in accordance with a preferred embodiment of the invention, a method for fabricating a low dielectric constant printed circuit board comprises dispersing an additive material in a low dielectric constant porous polymer layer; providing holes through the low dielectric constant porous polymer layer; applying a metallization layer over surfaces of the low dielectric constant porous polymer layer and surfaces of the holes; patterning the metallization layer; and removing the additive material from the low dielectric constant porous polymer layer.

In accordance with another preferred embodiment of the invention, a low dielectric constant printed circuit board comprises a low dielectric constant porous polymer layer having holes therethrough and a patterned metallization layer over surfaces of the low dielectric constant porous polymer layer and surfaces of the holes.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing, here like numerals represent like components, in which:

FIG. 3 is a view similar to that of FIG. 2 wherein the layers of metallization have been patterned.

FIG. 4 is a view similar to FIG. 3 with the additive material removed from the porous layer.

DETAILED DESCRIPTION OF A PREFERRED EMBODIMENT OF THE INVENTION

Figure 1:
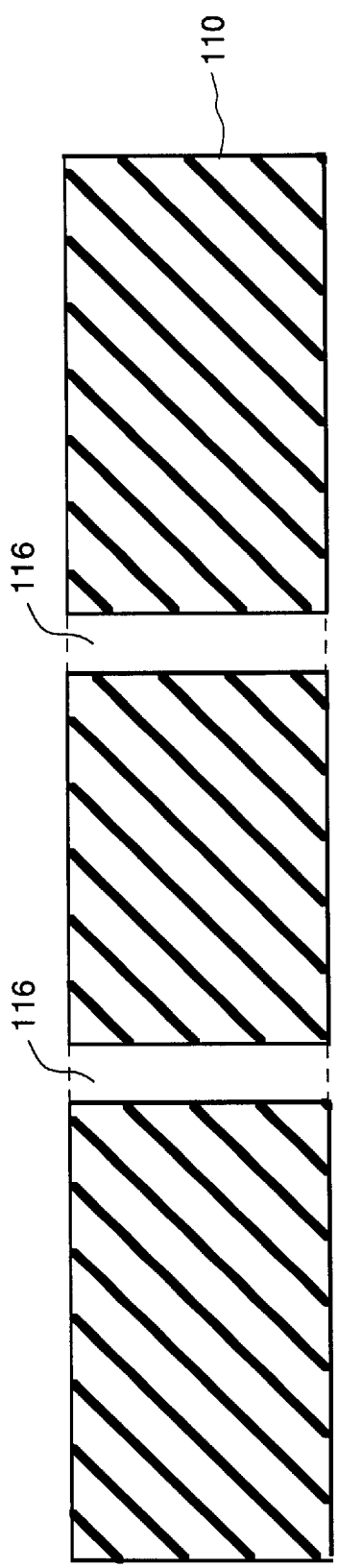
FIG. 1 is a sectional side view of a porous layer filled with additive material.

FIG. 1 is a sectional side view of a porous layer 110 filled with additive material. In one embodiment porous layer 110 comprises a porous PTFE material. In one example, the pores have diameters ranging approximately from 0.01 to 5 $\mu$m. Expanded PTFE is a useful porous layer because it does not dissolve in most of the fabricating chemicals and because it is sponge-like (permeable) so that additive material can be readily dispersed evenly throughout the layer. Other examples of potentially useful porous material include polyethylene and polystyrene, for example. Thicknesses of the porous material typically range from several microns to tens of mils so that mechanical stability of the PC boards can be maintained. Preferably the porous material is flexible enough so that it can be shaped to accommodate non-planar surfaces but is rigid enough that it does not sag.

The selected additive material must be capable of withstanding high processing temperatures and pressures and capable of removal after processing by any appropriate process, such as heat or a combination of heat and applied vacuum. For example, the additive material may comprise materials such as low melting temperature waxes, dyes such as anthraquinone (as well as derivatives of anthraquinone such as alizarin), beta carotene, and other similar unsaturated aliphatic structures, and other sublimable organic solids, such as adipic and other dicarboxylic acids. Some of these additive materials may require vacuum and heat combinations to sublime, whereas others tend to diffuse or evaporate from the material. A short list of sublimable materials can be found in the Handbook of Chemistry and Physics, 60th Ed. pages C-722–723. Many of the listed materials can be readily used with this invention. A combination of several additive materials may be desirable to provide a removable material which can absorb appropriate wavelengths for laser ablation.

Porous layer 110 can be immersed and soaked in the additive material which may be dissolved in a solvent. Ion implantation, pressure, or a combination of pressure and heat can be used to increase the permeation of the additive material throughout the porous layer.

Figure 2:
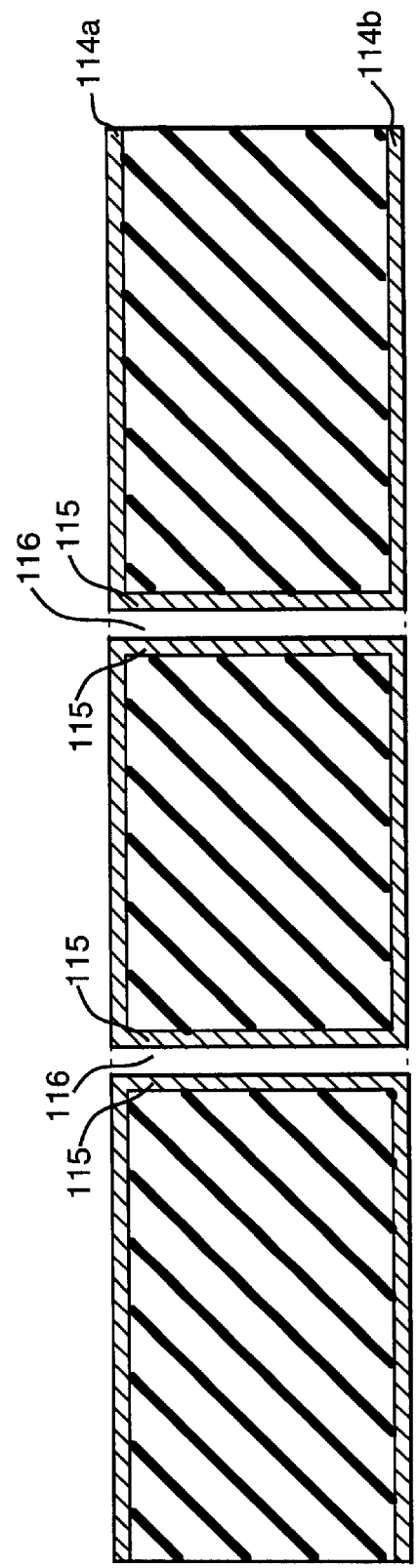
FIG. 2 is a view similar to that of FIG. 1 with the addition of layers of metallization on the porous layer.

FIG. 2 is a view similar to that of FIG. 1 with the addition of layers of metallization 114a, 114b, and 115 on the porous layer with layers 114a and 114b being situated over surfaces of porous layer 110 and layer 115 being situated over surfaces of holes 116. Preferably the layers are applied simultaneously.

The conventional method for fabricating through holes in printed circuit boards is to drill holes having diameters of about 5 to 10 mils: apply a seed metal layer such as palladium tin chloride by a technique such as dipping; apply a thin electroless metal layer such as copper; and finally electroplate a thicker metal layer such as copper with the combined thickness of the metals ranging from 4 to 20 microns, for example. For such electroplating to be effective, a contiguous underlying surface is needed. The existence of the additive material in the porous layer of the present invention provides such a contiguous surface because the pores are filled.

FIG. 3 is a view similar to that of FIG. 2 wherein the layers of metallization have been patterned. Patterning can be accomplished using standard photoresist techniques such as those discussed in Eichelberger et al., U.S. Pat. No. 4,783,695. After the layers of metallization are patterned, electronic components (not shown) can be inserted in the board and soldered, for example.

Figure 5:
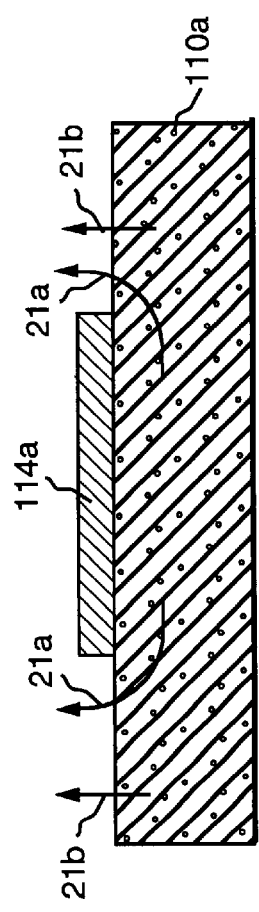
FIG. 5 is a sectional view along line 5—5 of FIG. 4 illustrating removal of the additive material.

FIG. 4 is a view similar to FIG. 3 with the additive material removed from the porous layer. After PC board fabrication, the additive material is removed from the board to form an additive-free, low dielectric constant porous layer 110a. FIG. 5 is an enlarged sectional side view along line 5–5' of FIG. 4. The PC board can be heated (either with or without vacuum conditions, depending on the additive material) to sublime, diffuse, or evaporate the additive material. Because the additive material does not sublime directly through the metallization layers, additive material under metallization has a longer release path 21a as compared with the release path 21b of additive material not under metallization. The longer release path may require a longer heating period. Perforation (not shown) of a metallization layer can be used to enhance removal of the additive material, if desired.

The removal of additive material dyes dissolved or dispersed in a polymer matrix occurs through a mechanism of interdiffusion. Dye molecules such as anthraquinone or alizarin are relatively small molecules and fit between the spaces of the coiled polymer chains which preferably make up the porous layer. When heated above the sublimation temperature which may be below the glass transition point, the individual dye molecules, in the gas phase, will vent or pass through these spaces and be released from the porous layer.

Because the additive material is removed after the application of the pattern of electrical conductors, the metal does not significantly protrude into the porous layer and thus has a smooth surface as required for low loss high frequency applications.

Certain light frequencies, such as UV (ultraviolet), aid in the decomposition of the additive material. UV light acts to scission the material and thus create smaller molecules which can move easily and pass out of the porous materials.

Figure 6:
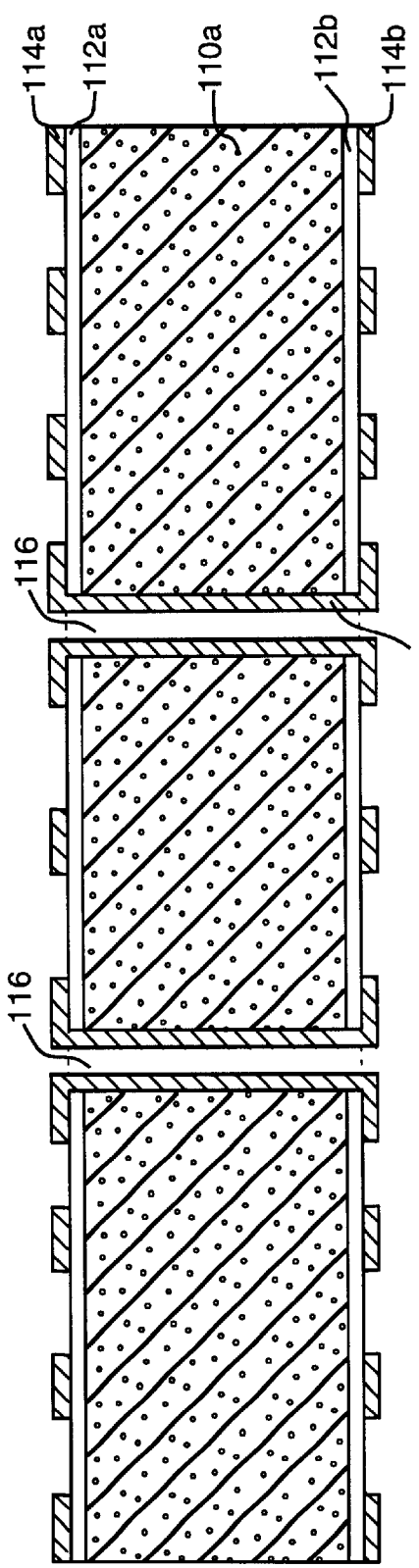
FIG. 6 is a sectional side view similar to that of FIG. 4 with the addition of adhesive material between the porous layer and the layers of metallization.

FIG. 6 is a sectional side view similar to that of FIG. 4 with the addition of adhesive material 112a and 112b between the porous layer and the layers of metallization. Adhesive material 112a and 112b is preferably applied to porous layer 110 after the porous layer and additive material have dried to prevent the adhesive from wicking or protruding into the pores. Thus the removal of the additive material from the porous layer can later be accomplished while maintaining sufficient adhesion of the porous layer to the layers of metallization in subsequent processing steps.

The porous layer is preferably coated on one or both surfaces with thin layers of adhesive comprising a material such as available from DuPont under the name AF 1600 or 2400 Teflon polytetrafluoroethylene, that is amorphous and maintains excellent adhesion to the porous layer after the additive material is removed. Other potentially useful adhesives with low dielectric constants include polyphenylene oxide and DuPont FEP or PFA Teflon polytetrafluoroethylene, for example. In one embodiment, the adhesive material is applied with a pinch roll laminator such as used in PC board processing.

The addition of the adhesive material increases the dielectric constant above the surface because dielectric constants generally act in series and are proportional to the relative thicknesses of the adjacent materials. When the porous layer is much thicker than the adhesive material, however, the dielectric constant can approach that of the porous layer and be suitably low. The thickness of the adhesive material varies with the surface roughness of the polymer layer and typically ranges from 5 to 20 microns, for example. Preferably the, adhesive material is of sufficient thickness to span the tops of the polymer surfaces and provide structural support and enhanced adhesion for the layers of metallization which would otherwise be adjacent the sponge-like structure (and thus the pores). It is expected that metal will maintain a contact to an adhesive more firmly than to a porous surface.

If desired, any adhesive 112a and 112b left exposed after the patterning of the metallization layer can be removed by a technique such as RIE (reactive ion etching), laser etching, or solvent dissolution, for example. In another embodiment, perforation (not shown) of the adhesive can be used to enhance removal of the additive material. If the exposed adhesive portions are not removed or perforated, then the conditions for removal of the additive material may need to be altered slightly so that the additive material sublimes or diffuses through the adhesive. Changes to the additive removal process can include higher temperature, lower pressure, and/or longer period of time.

FIGS. 7–12 are sectional side views of another embodiment of the present invention wherein a layer of metallization is formed over a porous layer prior to the step of metallizing through holes.

Figure 7:
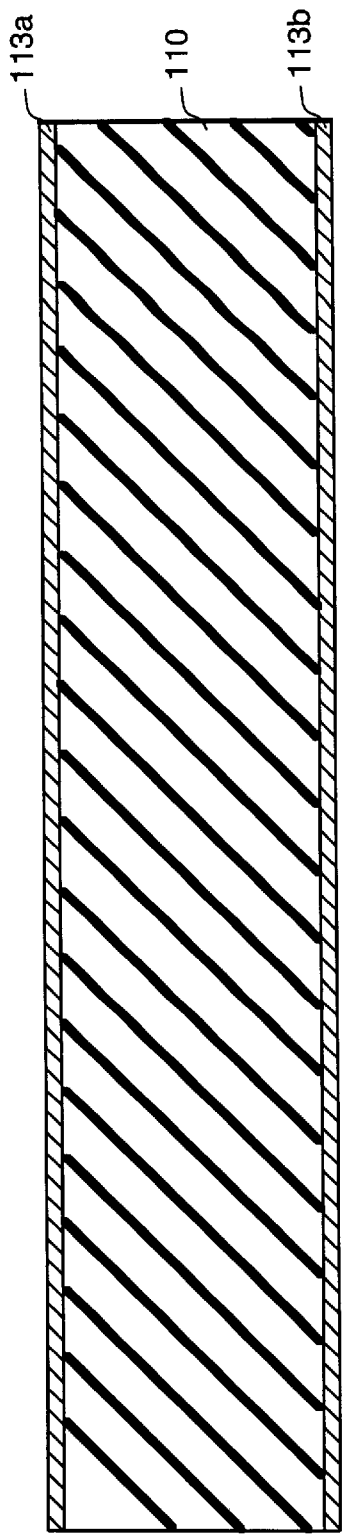
FIG. 7 is a sectional side view of a porous layer filled with additive material and coated with inner layers of metallization.

FIG. 7 is a sectional side view of a porous layer 110 filled with additive material and coated with inner layers of metallization 113a and 113b. The inner layers of metallization can be applied in a similar manner as discussed above with respect to FIG. 2.

Figure 8:
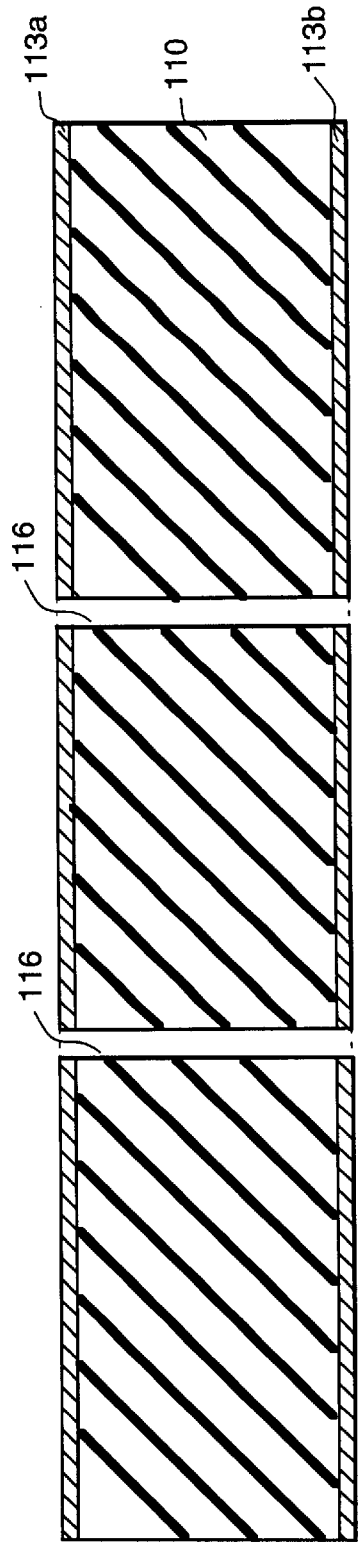
FIG. 8 is a view similar to that of FIG. 7 wherein through holes have been formed through the porous layer and inner layers of metallization.
Figure 9:
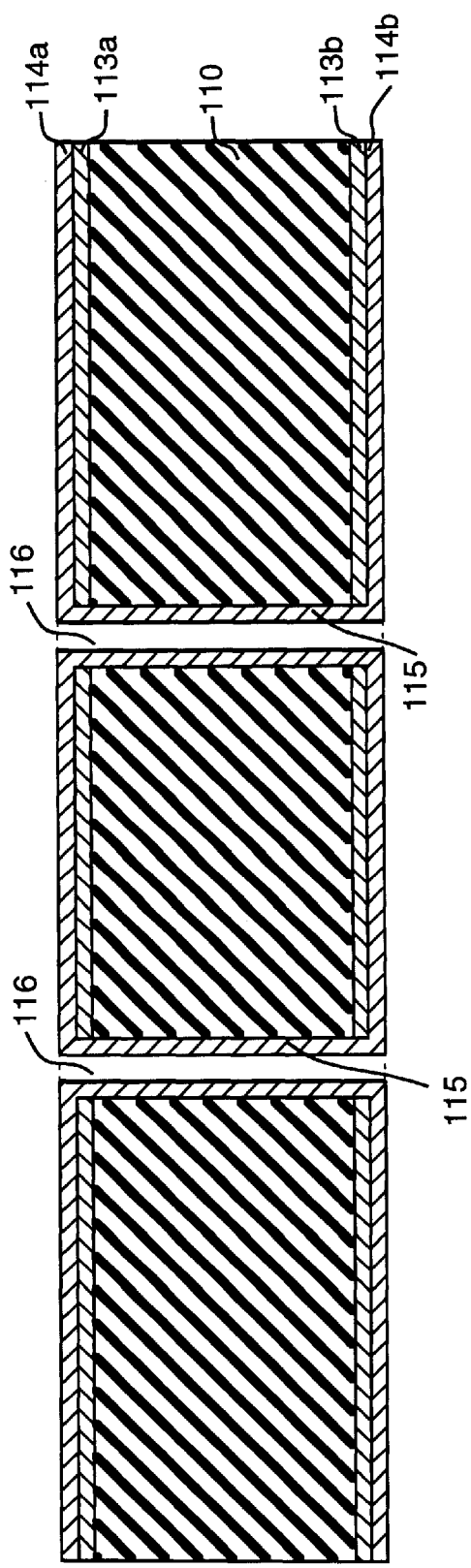
FIG. 9 is a view similar to that of FIG. 8 with the addition of outer layers of metallization.

FIG. 8 is a view similar to that of FIG. 7 wherein through holes 116 have been formed through the porous layer and inner layers of metallization. Holes 116 can be punched or drilled through the porous material and metallization. FIG. 9 is a view similar to that of FIG. 8 with the addition of outer layers of metallization 114a and 114b which can be applied in a similar manner as discussed above with respect to FIG. 2.

Figure 10:
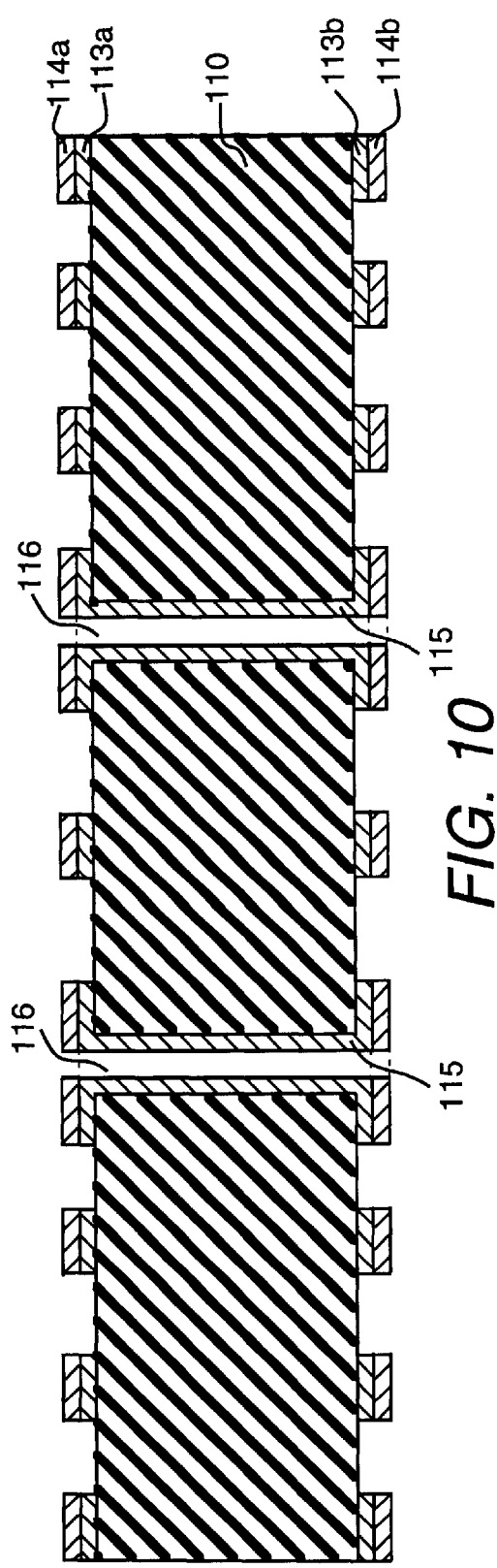
FIG. 10 is a view similar to that of FIG. 9, wherein the inner and outer layers of metallization have been patterned.
Figure 11:
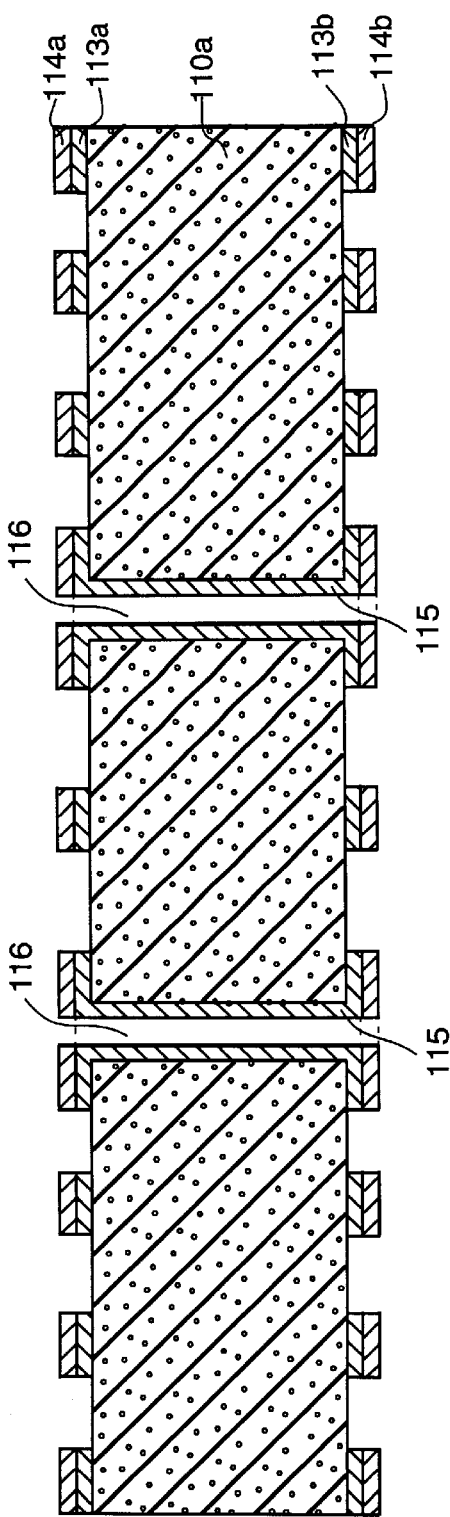
FIG. 11 is a view similar to FIG. 10 with the additive material removed from the porous layer.

FIG. 10 is a view similar to that of FIG. 9, wherein the inner and outer layers of metallization have been patterned by conventional photoresist techniques, for example, and FIG. 11 is a view similar to FIG. 10 with the additive material removed from the porous layer.

Figure 12:
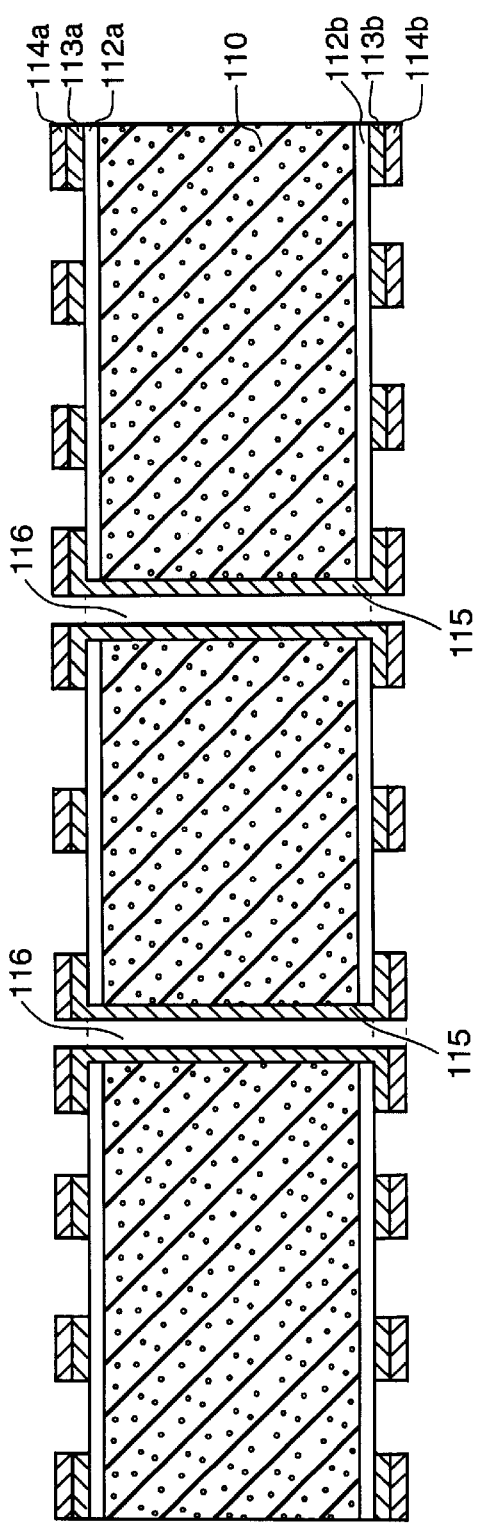
FIG. 12 is a sectional side view similar to that of FIG. 11 with the addition of adhesive material between the porous layer and the inner and outer layers of metallization.

FIG. 12 is a sectional side view similar to that of FIG. 11 with the addition of adhesive material 112a and 112b between the porous layer and the inner and outer layers of metallization. The adhesive is useful for reasons discussed above with respect to FIG. 6. The adhesive is additionally useful when inner metallization layers 113a and 113b are applied by lamination. If a flexible PC board is desired, a preferred material for the inner layers of metallization comprises rolled annealed copper.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A low dielectric constant printed circuit board, comprising:

a low dielectric constant porous polymer layer having holes therethrough, the porous layer having pores; and a patterned metallization layer over outer surfaces of the low dielectric constant porous polymer layer and inner surfaces of the holes, the patterned metallization layer not significantly protruding into the pores of the porous layer.

2. The printed circuit board of claim 1 further including a removable additive material dispersed in the low dielectric constant porous polymer layer.

3. A low dielectric constant printed circuit board, comprising:
   a low dielectric constant porous polymer layer having holes therethrough, the porous layer having pores;
   a patterned metallization layer over outer surfaces of the low dielectric constant porous polymer layer and inner surfaces of the holes, the patterned metallization layer not significantly protruding into the pores of the porous layer; and
   adhesive between the outer surfaces of the low dielectric constant porous polymer layer and the, patterned metallization layer, the adhesive not significantly protruding into the pores of the porous layer.

4. The printed circuit board of claim 3, wherein the low dielectric constant porous polymer layer comprises a material selected from the group consisting of polytetrafluoroethylene, polyethylene, and polystyrene.

5. The printed circuit board of claim 4, wherein the adhesive comprises a material selected from the group consisting of polytetrafluoroethylene and polyphenylene oxide.

6. The printed circuit board of claim 3 further including a removable additive material dispersed in the low dielectric constant porous polymer layer.

7. A low dielectric constant printed circuit board, comprising:
   a low dielectric constant porous polymer layer having holes therethrough, the porous layer having pores with a removable additive material dispersed therein; and
   a patterned metallization layer over outer surfaces of the low dielectric constant porous polymer layer and inner surfaces of the holes.

8. A low dielectric constant printed circuit board, comprising:
   a low dielectric constant porous polymer layer having holes therethrough, the porous layer having pores with a removable additive material dispersed therein;
   a patterned metallization layer over outer surfaces of the low dielectric constant porous polymer layer and inner surfaces of the holes; and
   adhesive between the outer surfaces of the low dielectric constant porous polymer layer and the patterned metallization layer.

\* \* \* \* \*

UNITED STATES PATENT AND TRADEMARK OFFICE
CERTIFICATE OF CORRECTION

PATENT NO. : 6,297,459 B1  
DATED : October 2, 2001  
INVENTOR(S) : Robert J. Wojnarowski et al.

Page 1 of 1

It is certified that error appears in the above-identified patent and that said Letters Patent is hereby corrected as shown below:

<u>Column 7, claim 3,</u>  
Line 11, please delete ",".

Signed and Sealed this

Twenty-sixth Day of March, 2002

Attest:

JAMES E. ROGAN  
*Attesting Officer*  *Director of the United States Patent and Trademark Office*